US010014439B2

(12) United States Patent
Freund et al.

(10) Patent No.: US 10,014,439 B2
(45) Date of Patent: *Jul. 3, 2018

(54) SYSTEM AND METHOD FOR PROVIDING AN ELECTRON BLOCKING LAYER WITH DOPING CONTROL

(71) Applicant: Avago Technologies General IP (Singapore) Pte. Ltd., Singapore (SG)

(72) Inventors: Joseph M. Freund, Fogelsville, PA (US); John M. DeLucca, Wayne, PA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/215,968

(22) Filed: Jul. 21, 2016

(65) Prior Publication Data

US 2016/0329463 A1    Nov. 10, 2016

Related U.S. Application Data

(63) Continuation of application No. 13/969,773, filed on Aug. 19, 2013, now Pat. No. 9,425,050.

(Continued)

(51) Int. Cl.
*H01L 33/14* (2010.01)
*H01L 21/02* (2006.01)
(Continued)

(52) U.S. Cl.
CPC ........ *H01L 33/145* (2013.01); *H01L 21/0242* (2013.01); *H01L 21/0254* (2013.01);
(Continued)

(58) Field of Classification Search
CPC . H01L 21/02439; H01L 29/15; H01L 33/145; H01L 51/50; H01L 21/22; H01L 21/02488; G02F 1/017
See application file for complete search history.

(56) References Cited

U.S. PATENT DOCUMENTS 9,425,050 B2 * 8/2016 Freund ................ H01L 21/0242
2007/0241676 A1   10/2007 Park et al.
(Continued)

FOREIGN PATENT DOCUMENTS

KR    20010017249 A    8/1999

OTHER PUBLICATIONS

Garrett Atkins, Manuel Marya, David Olson, Dan Eliezer; Magnesium-Lithium Alloy Weldability: A Microstructural Characterization; Magnesium Technology; 2004; pp. 37-41.
(Continued)

*Primary Examiner* — Matthew Landau
*Assistant Examiner* — Mark Hatzilambrou
(74) *Attorney, Agent, or Firm* — Sheridan Ross P.C.

(57) ABSTRACT

Aspects of the disclosure pertain to a system and method for providing an electron blocking layer with doping control. The electron blocking layer is included in a semiconductor assembly. The electron blocking layer includes a lithium aluminate layer. The lithium aluminate layer promotes reduced diffusion of magnesium into a layer stack of the semiconductor assembly.

20 Claims, 5 Drawing Sheets

Related U.S. Application Data

(60) Provisional application No. 61/866,588, filed on Aug. 16, 2013.

(51) Int. Cl.
*H01L 21/22* (2006.01)
*H01L 29/15* (2006.01)

(52) U.S. Cl.
CPC .. *H01L 21/02458* (2013.01); *H01L 21/02488* (2013.01); *H01L 21/02507* (2013.01); *H01L 21/02513* (2013.01); *H01L 21/02576* (2013.01); *H01L 21/02579* (2013.01); *H01L 21/2205* (2013.01); *H01L 29/15* (2013.01)

(56) References Cited

U.S. PATENT DOCUMENTS

| | | |
|---|---|---|
| 2008/0055715 A1 | 3/2008 | Fei et al. |
| 2011/0140083 A1 | 6/2011 | Driscoll et al. |
| 2011/0291147 A1 | 12/2011 | Hu et al. |
| 2012/0119218 A1 | 5/2012 | Su |
| 2012/0195032 A1 | 8/2012 | Shew |

OTHER PUBLICATIONS

T. Stephan, K. Kohler, M. Maier, M. Kunzer, P. Schlotter and J. Wagner; Influence of Mg doping profile on the elctroluminescence properties of GaInN multiple quantum well light emitting diodes; Light-Emitting Diodes: Research, Manufacturing, and Applications VI II; vol. 5366; pp. 118-126.

Novel Approaches to High-Efficiency 111-V Nitride Heterostructure Emitters for Next-Generation Lighting Applications; Georgia Institute of Technology; Jan. 2005; pp. 1-21.

Y. A. Xi and E. F. Schubert; Determination of Al mole fraction in AlGaN by X-ray diffraction and optical transmittance; pp. 1-1.

Robert A. Hatch; Phase Equilibrium in the System; The American Mineralogist; Sep.-Oct. 1943; vol. 28, No. 9 & 10; pp. 471-496.

Kevin Donaher; Lithium Doping of Single-Walled Carbon Nanotubes for Battery and Semiconductor Applications; Columbia University; pp. 1-1.

KE Long, Florian Pschentizka and J. C. Sturm; Three-Color Passive-Matrix Pixels Using Dye-Diffusion-Patterned Tri-Layer Polymer-Based LED; Materials Research Society; 2002; vol. 708; pp. 1-6.

M. L. Nakarmi, K. H. Kim, M. Khizar, Z. Y. Fan, J. Y. Lin, and H. X. Jiang; Electrical and optical properties of Mg-doped Al0.7Ga0.3N alloys; Applied Physics Letters; 2005; 86, 092108-1; pp. 1-3.

Movpe growth and characterization of (In, Ga)N quantum structures for laser diodes emitting at 440 nm; Berlin; 2011; pp. 1-105.

Mary H. Crawford; LEDS for Solid-State Lighting: Performance Challenges and Recent Advances; IEEE Journal of Selected Topics in Quantum Electronics; Jul./Aug. 2009; vol. 15, No. 4; pp. 1028-1040.

Approaches for optimizing light emitting diode structures based on 111-N materials; Aalto University—Doctoral Dissertations; pp. 1-77.

Nordine Sebkhi; a Study of Efficiency Droop of Green Light Emitting Diodes Grown by Metalorganic Chemical Vapor Deposition; Georgia Institute of Technology; Dec. 2011; pp. 1-100.

Lithium aluminate substrate for low-cost nonpolar gallium nitride; Semiconductor Today; Oct. 2012; vol. 7, Issue 8; pp. 82-85.

\* cited by examiner

SYSTEM AND METHOD FOR PROVIDING AN ELECTRON BLOCKING LAYER WITH DOPING CONTROL

CROSS-REFERENCE TO RELATED APPLICATIONS

This application is a continuation of U.S. patent application Ser. No. 13/969,773 filed on Aug. 19, 2013, claims priority to U.S. Provisional Application Number: 61/866,588 filed on Aug. 16, 2013, entitled: "System and Method for Providing an Electron Blocking Layer with Doping Control," which is hereby incorporated by reference in its entirety.

FIELD OF THE INVENTION

The present disclosure relates to the field of semiconductor device processing and particularly to a system and method for providing an electron blocking layer with doping control.

BACKGROUND

The parameter presently used to control the magnesium doping profile during semiconductor device processing (e.g., light emitting diode (LED) processing) is growth temperature. The magnesium doping profile depends on the growth temperature of the layers of the semiconductor device because the diffusion of the magnesium is temperature dependent.

SUMMARY

This Summary is provided to introduce a selection of concepts in a simplified form that are further described below in the Written Description. This Summary is not intended to identify key and/or essential features of the claimed subject matter. Also, this Summary is not intended to limit the scope of the claimed subject matter in any manner Aspects of the disclosure pertain to a system and method for providing an electron blocking layer with doping control.

DESCRIPTION OF THE FIGURES

The detailed description is described with reference to the accompanying figures.

WRITTEN DESCRIPTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will fully convey the scope. Among other things, the features of the disclosure can be facilitated by methods, devices, and/or embodied in articles of commerce. The following detailed description is, therefore, not to be taken in a limiting sense.

Figure 1:
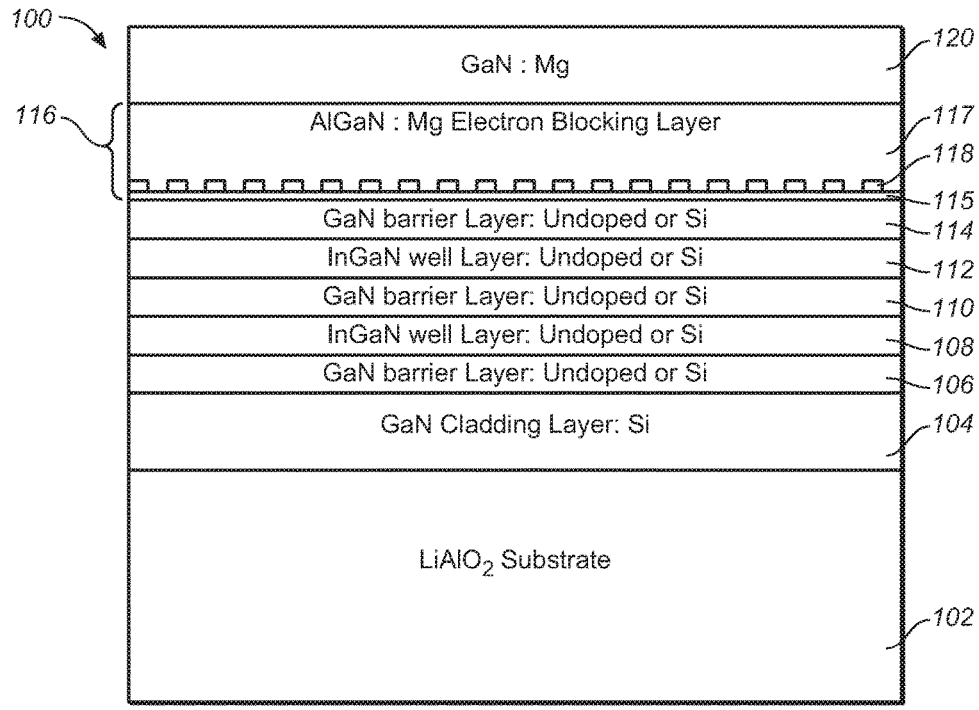
FIG. 1 is an example conceptual block diagram schematic of a semiconductor assembly in which the lithium aluminate layer of the electron blocking layer is patterned and is formed upon an undoped (e.g., non-doped) aluminum gallium nitride layer in accordance with an exemplary embodiment of the present disclosure.

Referring to FIG. 1 (FIG. 1), an example block diagram of a semiconductor assembly 100 in accordance with an exemplary embodiment of the present disclosure is shown. In embodiments, the semiconductor assembly 100 is or may be implemented in a semiconductor device, such as a gallium nitride (GaN)-based semiconductor device. For instance, the semiconductor device may be a surface emitting laser (SEL), an edge emitting laser, a light emitting diode (e.g., top emitting, edge emitting), and/or the like. In embodiments, the semiconductor assembly 100 includes a substrate 102. For instance, the substrate 102 is a lithium aluminate (LiAlO$_2$) substrate (e.g., is formed of lithium aluminate). In other embodiments, the substrate is a substrate used in the manufacture of nitride devices, which includes aluminum oxide (Al$_2$O$_3$) (e.g., sometimes called sapphire) and/or silicon carbide (SiC).

In examples, the semiconductor assembly 100 includes a cladding layer 104. For example, the cladding layer 104 is a silicon (Si)-doped gallium nitride (GaN) cladding layer. In examples, the cladding layer 104 is formed upon (e.g., layered upon, stacked upon, grown upon) the substrate 102. For instance, the cladding layer 104 is formed upon the substrate 102 via a deposition process, such as a metalorganic chemical vapor deposition (MOCVD) process.

In embodiments, the semiconductor assembly 102 includes a first barrier layer 106. For example, the first barrier layer 106 may be a silicon-doped gallium nitride barrier layer or an undoped gallium nitride barrier layer. In examples, the first barrier layer 106 is formed upon (e.g., layered upon, stacked upon, grown upon) the cladding layer 104. For instance, the first barrier layer 106 is formed upon the cladding layer 104 via a deposition process, such as a metalorganic chemical vapor deposition (MOCVD) process.

In examples, the semiconductor assembly 100 includes a first well layer 108. For example, the first well layer 108 may be a silicon-doped indium gallium nitride (InGaN) well layer or an undoped indium gallium nitride well layer. In embodiments, the first well layer 108 is formed upon (e.g., layered upon, stacked upon, grown upon) the first barrier layer 106. For instance, the first well layer 108 is formed upon the first barrier layer 106 via a deposition process, such as a metalorganic chemical vapor deposition (MOCVD) process.

In examples, the semiconductor assembly 100 includes a second barrier layer 110. For example, the second barrier layer 110 may be a silicon-doped gallium nitride barrier layer or an undoped gallium nitride barrier layer. In embodiments, the second barrier layer 110 is formed upon (e.g., layered upon, stacked upon, grown upon) the first well layer 108. For instance, the second barrier layer 110 is formed upon the first well layer 108 via a deposition process, such as a metalorganic chemical vapor deposition (MOCVD) process.

In embodiments, the semiconductor assembly 100 includes a second well layer 112. For example, the second well layer 112 may be a silicon-doped indium gallium nitride (InGaN) well layer or an undoped indium gallium nitride well layer. In examples, the second well layer 112 is formed upon (e.g., layered upon, stacked upon, grown upon) the second barrier layer 110. For instance, the second well layer 112 is formed upon the second barrier layer 110 via a deposition process, such as a metalorganic chemical vapor deposition (MOCVD) process.

In examples, the semiconductor assembly 100 includes a third barrier layer 114. For example, the third barrier layer 114 may be a silicon-doped gallium nitride barrier layer or an undoped gallium nitride barrier layer. In embodiments, the third barrier layer 114 is formed upon (e.g., layered upon, stacked upon, grown upon) the second well layer 112. For instance, the third barrier layer 114 is formed upon the second well layer 112 via a deposition process, such as a metalorganic chemical vapor deposition (MOCVD) process.

In examples, the semiconductor assembly 100 (e.g., sample, wafer) includes an electron blocking layer 116. For instance, the electron blocking layer 116 is a magnesium-doped aluminum gallium nitride (AlGaN) electron blocking layer. In examples, the electron blocking layer 116 is formed upon (e.g., layered upon, stacked upon, grown upon) the third barrier layer 114. For instance, the electron blocking layer 116 (e.g., an approximately 10 nanometer thick electron blocking layer) shown in FIG. 1 is formed by a series of steps. First, a thin layer (e.g., on the order of 1 nanometer (nm) thick) of undoped or lightly-doped aluminum gallium nitride layer 115 is grown upon the third barrier layer 114. For example, the undoped or lightly-doped aluminum gallium nitride layer 115 may be formed upon the third barrier layer 114 using a deposition process, such as a metalorganic chemical vapor deposition (MOCVD) process. Second, a layer (e.g., on the order of 1-2 nanometers thick) of lithium aluminate ($LiAlO_2$) 118 is grown upon the thin layer of aluminum gallium nitride 115. For instance, the layer of lithium aluminate 118 may be formed upon the thin layer of aluminum gallium nitride 115 using a deposition process, such as atomic layer deposition (ALD). Third, the layer of lithium aluminate 118 formed upon the thin layer of aluminum gallium nitride 115 is then patterned. For example, the layer of lithium aluminate 118 is patterned using standard patterning processes. Examples of standard patterning processes include dry etching processes (e.g., plasma etching processes), such as reactive ion etching (RIE), deep reactive ion etching (DRIE) or wet etching processes. In examples, the patterned layer of lithium aluminate 118 may form uniformly-spaced stripes or islands of lithium aluminate. For instance, the stripes or islands of lithium aluminate 118 could be configured in a variety of dimensions (e.g., length*width*height), sizes, geometries, arrangements and/or shapes, such as square-shaped islands on the order of 5 micrometer (um) by 5 micrometers by 1 nanometer, with 5 micrometer spacing between each island. Further, a more heavily magnesium-doped layer (e.g., on the order of 9 nanometers thick) of aluminum gallium nitride 117 is grown over the patterned lithium aluminate layer 118 and over the aluminum gallium nitride layer 115 to form the electron blocking layer 116. For example, the more heavily magnesium-doped layer of aluminum gallium nitride 117 is formed over the patterned lithium aluminate layer 118 and aluminum gallium nitride layer 115 via a deposition process, such as a metalorganic chemical vapor deposition (MOCVD) process. In examples, patterning the layer of lithium aluminate 118, as shown in FIG. 1, maintains electrical properties of the semiconductor assembly (e.g., semiconductor device) 100, yet provides a barrier for promoting reduction of and/or preventing back diffusion of magnesium into the well layers (e.g., multiple quantum well (MQW) layers) 108, 112. In embodiments, the aluminum-rich composition (e.g., aluminum gallium nitride) of the electron blocking layer 116 promotes lattice-matching with the lithium aluminate layer 118. In examples, a magnesium-doped gallium nitride layer 120 is formed over the electron blocking layer 116.

Figure 2:
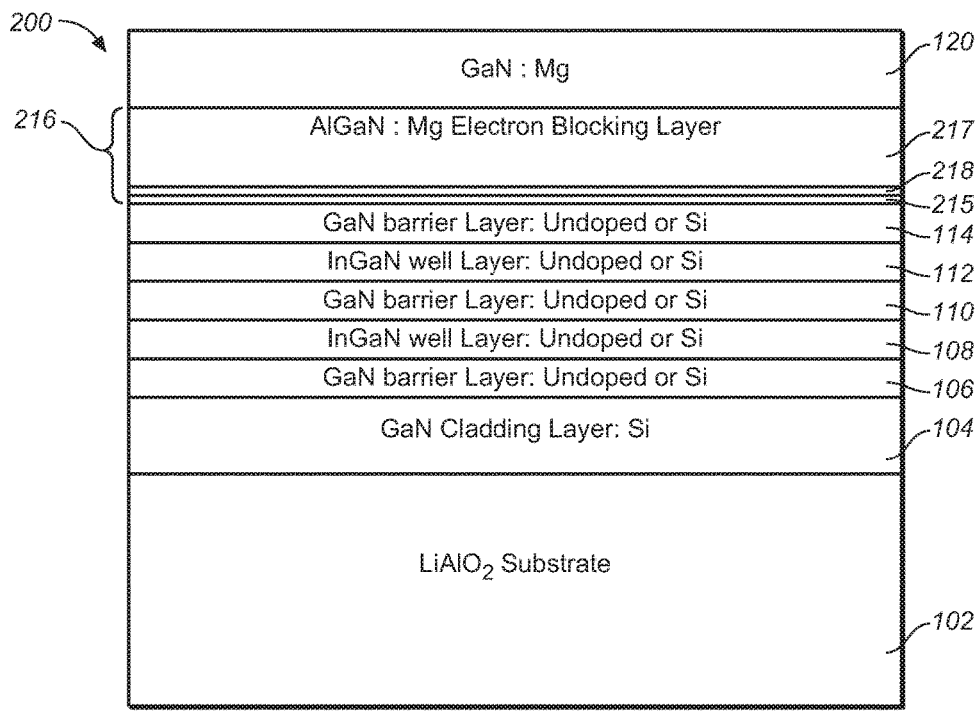
FIG. 2 is an example conceptual block diagram schematic of a semiconductor assembly in which the lithium aluminate layer of the electron blocking layer is continuous and is formed upon an undoped aluminum gallium nitride layer in accordance with a further exemplary embodiment of the present disclosure.

Referring to FIG. 2 (FIG. 2) an example block diagram of a semiconductor assembly 200 in accordance with a further exemplary embodiment of the present disclosure is shown. In the embodiment illustrated in FIG. 2, the semiconductor assembly 200 is generally similar in structure and function to the semiconductor assembly 100 shown in FIG. 1. However, the electron blocking layer 216 of the semiconductor assembly 200 shown in FIG. 2 differs from the electron blocking layer 116 shown in FIG. 1. In embodiments, electron blocking layer 216 shown in FIG. 2 is formed by growing a layer of undoped or lightly-doped aluminum gallium nitride 215 upon the third barrier layer 114 and growing a layer of lithium aluminate 218 upon the layer of undoped or lightly-doped aluminum gallium nitride 215. The more heavily magnesium-doped layer of aluminum gallium nitride 217 is then formed over the lithium aluminate layer 218 and aluminum gallium nitride layer 215. However, in the electron blocking layer 216 shown in FIG. 2, the layer of lithium aluminate 218 is not patterned, but rather, left as a continuous layer within the electron blocking layer 216. The choice of whether to pattern the layer of lithium aluminate (as in FIG. 1) or whether to leave the layer of lithium aluminate as a continuous layer (as in FIG. 2) depends upon the specific formulation and electrical properties of the electron blocking layer. In examples, the electron blocking layer 216 shown in FIG. 2 provides a desirable diffusion barrier to magnesium if the electrical properties of the layer can be tailored properly to the remaining structure such that adequate light emitting diode (LED) performance is attained.

Figure 3:
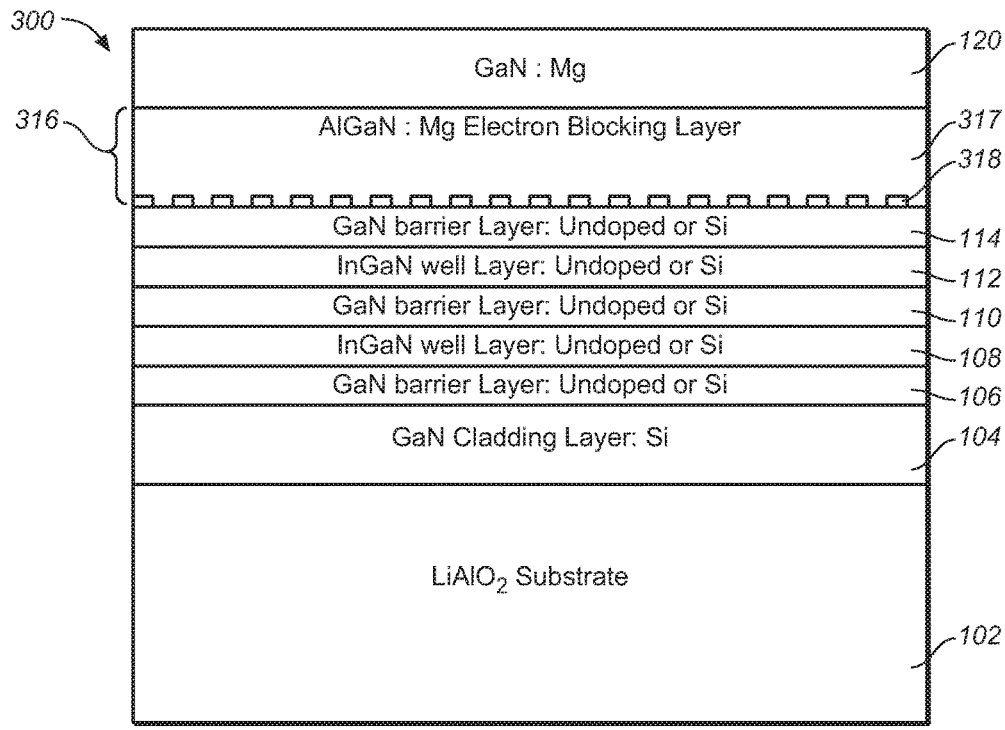
FIG. 3 is an example conceptual block diagram schematic of a semiconductor assembly in which the lithium aluminate layer of the electron blocking layer is patterned and is formed directly upon the third barrier layer in accordance with a further exemplary embodiment of the present disclosure.

Referring to FIG. 3 (FIG. 3) an example block diagram of a semiconductor assembly 300 in accordance with a further exemplary embodiment of the present disclosure is shown. In the embodiment illustrated in FIG. 3, the semiconductor assembly 300 is generally similar in structure and function to the semiconductor assembly 100 shown in FIG. 1. However, the electron blocking layer 316 of the semiconductor assembly 300 shown in FIG. 3 differs from the electron blocking layer 116 of the semiconductor assembly 100 shown in FIG. 1. Rather than growing a layer of undoped or lightly-doped aluminum gallium nitride 115 upon the third barrier layer 114, and then growing a layer of lithium aluminate 118 upon the layer of undoped or lightly-doped aluminum gallium nitride 115, as shown in FIG. 1, in the electron blocking layer 316 shown in FIG. 3, the lithium aluminate layer 318 is grown directly upon the third barrier layer 114, and there is no undoped aluminum gallium nitride layer. The more heavily magnesium-doped layer of aluminum gallium nitride 317 is then formed over the lithium aluminate layer 318. In examples, the semiconductor assembly 300 promotes efficiency by reducing the number of layers to grow by one. In the semiconductor assembly 300 shown in FIG. 3, the lithium aluminate layer 318 is patterned.

Figure 4:
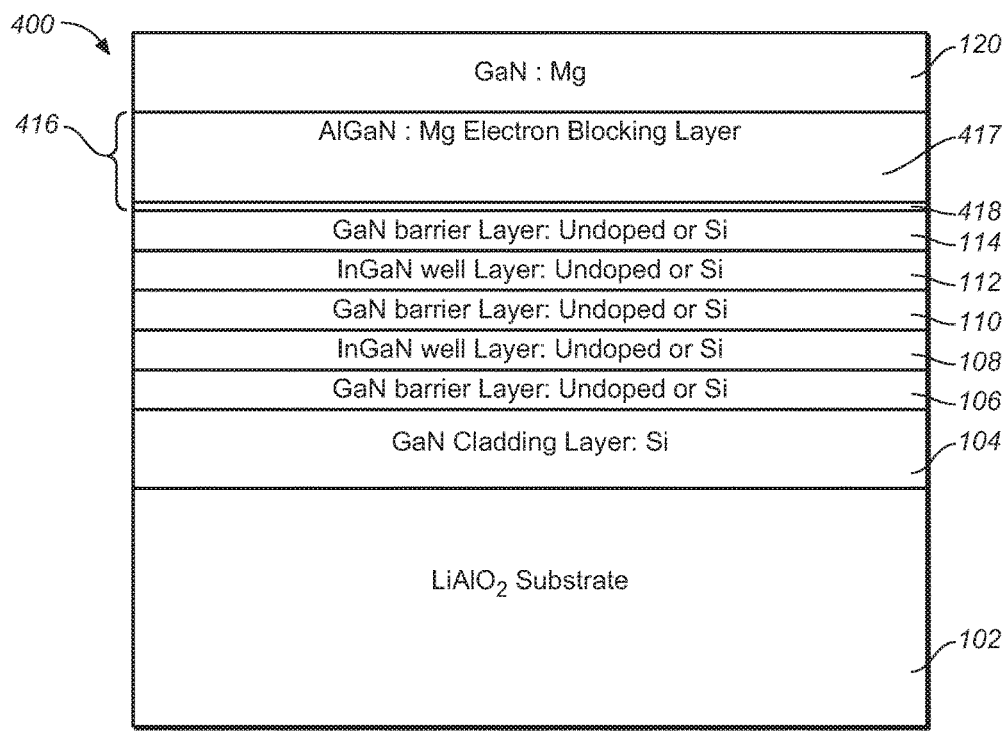
FIG. 4 is an example conceptual block diagram schematic of a semiconductor assembly in which the lithium aluminate layer of the electron blocking layer is continuous and is formed directly upon the third barrier layer in accordance with a further exemplary embodiment of the present disclosure.

Referring to FIG. 4 (FIG. 4) an example block diagram of a semiconductor assembly 400 in accordance with a further exemplary embodiment of the present disclosure is shown. In the embodiment illustrated in FIG. 4, the semiconductor assembly 400 is generally similar in structure and function to the semiconductor assembly 300 shown in FIG. 3. The electron blocking layer 416 is formed by growing the lithium aluminate layer 418 directly upon the third barrier layer 114 and forming the magnesium-doped layer of aluminum gallium nitride 417 over the lithium aluminate layer 418. However, the semiconductor assembly 400 shown in FIG. 4 differs from the semiconductor assembly 300 shown in FIG. 3 in that the lithium aluminate layer 418 of the semiconductor assembly 400 shown in FIG. 4 is left as a continuous layer, while the lithium aluminate layer 318 of the semiconductor assembly 300 shown in FIG. 3 is a patterned layer. In examples, the electron blocking layer 416 shown in FIG. 4 provides a more desirable diffusion barrier to magnesium if the electrical properties of the layer can be tailored properly to the remaining structure such that adequate light emitting diode (LED) performance is attained.

Figure 5:
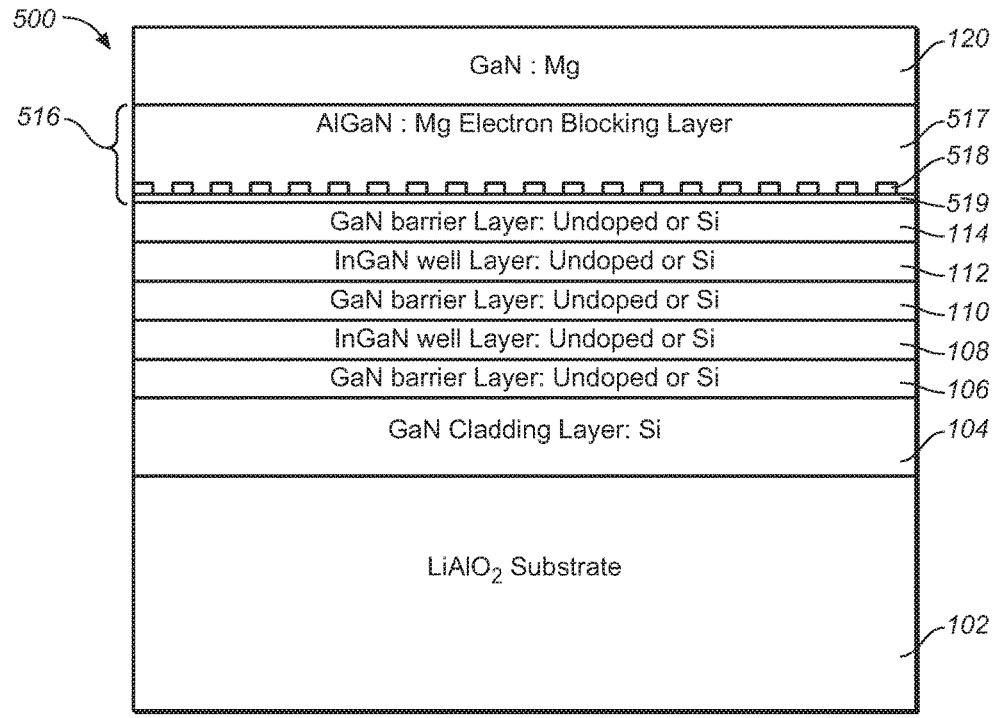
FIG. 5 is an example conceptual block diagram schematic of a semiconductor assembly in which the lithium aluminate layer of the electron blocking layer is patterned and is formed upon an aluminum nitride layer which is formed upon the third barrier layer in accordance with an exemplary embodiment of the present disclosure.

Referring to FIG. 5 (FIG. 5) an example block diagram of a semiconductor assembly 500 in accordance with a further exemplary embodiment of the present disclosure is shown. In the embodiment shown in FIG. 5, the semiconductor assembly 500 is generally similar in structure and function to the semiconductor assembly 100 shown in FIG. 1. However, the electron blocking layer 516 of the semiconductor assembly 500 shown in FIG. 5 is different than the electron blocking layer 116 of the semiconductor assembly 100 shown in FIG. 1. In embodiments, the electron blocking layer 516 is formed by growing a layer of aluminum nitride (AlN) 519 upon the third barrier layer 114, growing the lithium aluminate layer 518 upon the aluminum nitride layer 519 and forming a magnesium-doped layer of aluminum gallium nitride 517 over the lithium aluminate layer 518 and aluminum nitride layer 519. Further, in the semiconductor assembly 500 shown in FIG. 5, there is no undoped or lightly-doped aluminum gallium nitride layer 115. In examples, the semiconductor assembly 500 shown in FIG. 5, by introducing the aluminum nitride layer 519 may promote stress reduction between the electron blocking layer 518 and the third barrier layer 114.

Figure 6:
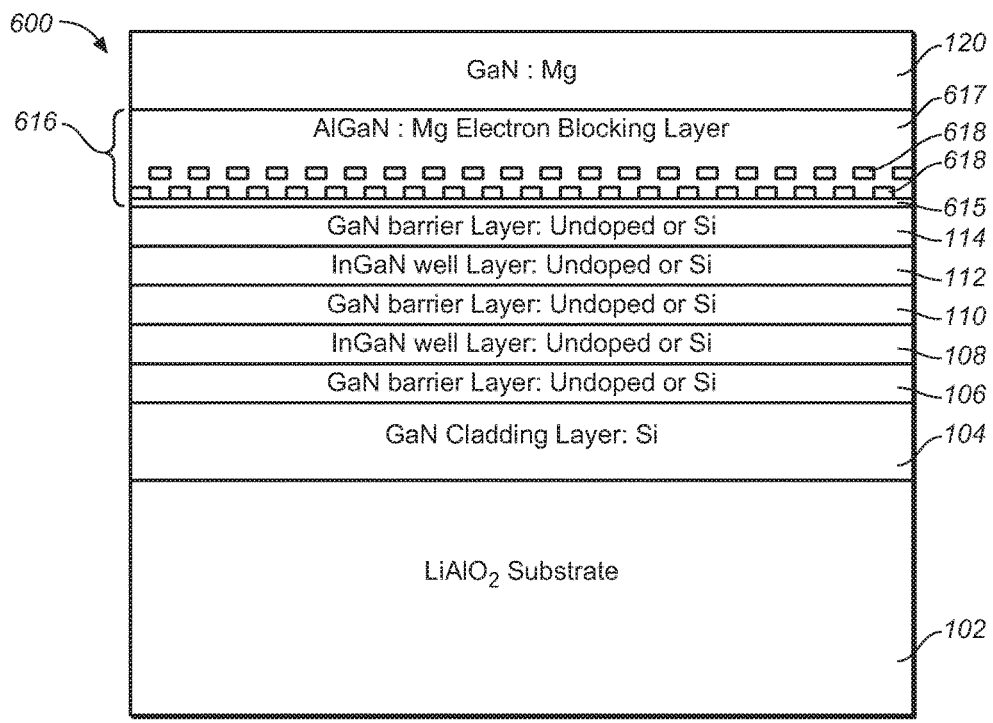
FIG. 6 is an example conceptual block diagram schematic of a semiconductor assembly in which the lithium aluminate layer of the electron blocking layer is patterned to form dual rows of islands and is formed upon an undoped aluminum gallium nitride layer in accordance with an exemplary embodiment of the present disclosure.

Referring to FIG. 6 (FIG. 6) an example block diagram of a semiconductor assembly 600 in accordance with a further exemplary embodiment of the present disclosure is shown. In the embodiment shown in FIG. 6, the semiconductor assembly 600 is generally similar in structure and function to the semiconductor assembly 100 shown in FIG. 1. However, the electron blocking layer 616 of the semiconductor assembly 600 shown in FIG. 6 is different than the electron blocking layer 116 of the semiconductor assembly 100 shown in FIG. 1. In examples, the electron blocking layer 616 of the semiconductor assembly 600 shown in FIG. 6 is formed by growing an undoped or lightly-doped aluminum gallium nitride layer 615 upon the third barrier layer 114, growing a lithium aluminate layer 618 upon the undoped aluminum gallium nitride layer 615, patterning the lithium aluminate layer 618, and growing a more heavily magnesium-doped layer of aluminum gallium nitride 617 over the patterned lithium aluminate layer 618 and over the undoped or lightly-doped aluminum gallium nitride layer 615. In the semiconductor assembly 600 shown in FIG. 6, the patterned lithium aluminate layer 618 is formed such that it has multiple (e.g., dual) rows/layers of interleaved islands of lithium aluminate. In examples, standard growth, re-growth and/or patterning processing are used to form the patterned lithium aluminate layer 618. In embodiments, the patterned lithium aluminate layer 618 shown in FIG. 6 maintains electrical properties of the semiconductor assembly 600, yet provides an effective line of sight barrier for reducing/preventing back diffusion of magnesium into the well layers 108, 112.

Figure 7:
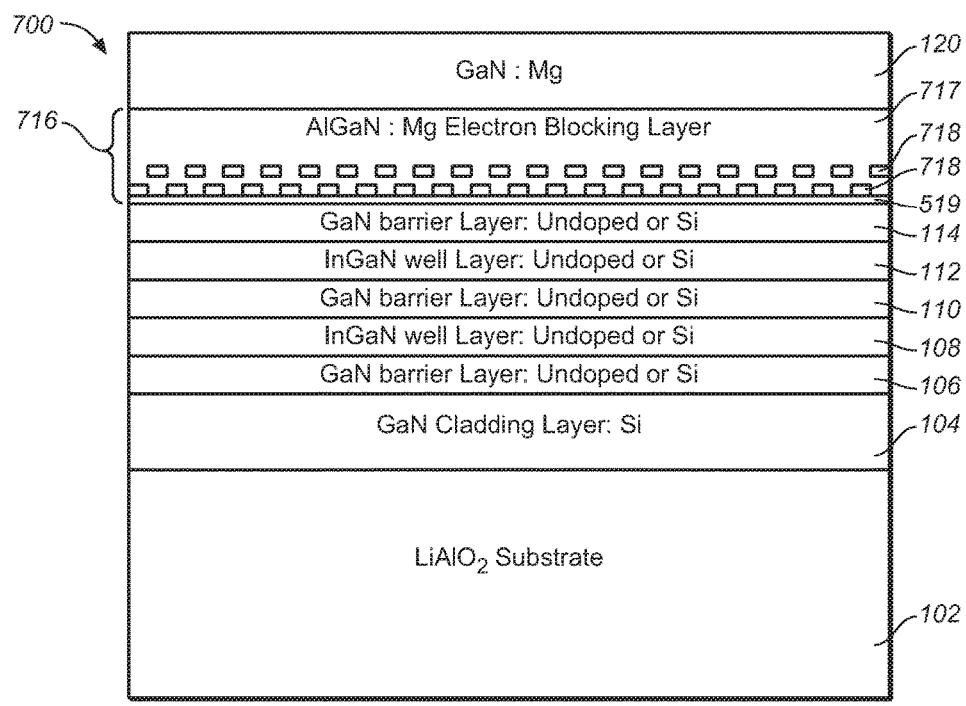
FIG. 7 is an example conceptual block diagram schematic of a semiconductor assembly in which the lithium aluminate layer of the electron blocking layer is patterned to form dual rows of islands and is formed upon an aluminum nitride layer which is formed upon the third barrier layer in accordance with an exemplary embodiment of the present disclosure.

Referring to FIG. 7 (FIG. 7) an example block diagram of a semiconductor assembly 700 in accordance with a further exemplary embodiment of the present disclosure is shown. In the embodiment shown in FIG. 7, the semiconductor assembly 700 is generally similar in structure and function to the semiconductor assembly 600 shown in FIG. 6. However, the electron blocking layer 716 of the semiconductor assembly 700 shown in FIG. 7 is different than the electron blocking layer 616 of the semiconductor assembly 600 shown in FIG. 6. In examples, the electron blocking layer 716 of the semiconductor assembly 700 shown in FIG. 7 is formed by growing an aluminum nitride layer 519 upon/over the third barrier layer 114, growing the lithium aluminate layer 718 upon the aluminum nitride layer 519. As with the lithium aluminate layer 618 of the semiconductor device 600 shown in FIG. 6, the lithium aluminate layer 718 of the semiconductor assembly 700 shown in FIG. 7 is patterned and configured as a multi-row/multi-layer lithium aluminate layer 718, such that it has multiple (e.g., dual) rows/layers of interleaved islands of lithium aluminate. In examples, by including the layer of aluminum nitride 519, the electron blocking layer 716 of the semiconductor assembly 700 shown in FIG. 7 promotes stress reduction between the gallium nitride and aluminum gallium nitride of the semiconductor assembly 700.

The semiconductor assembly embodiments disclosed herein promote improved control of a magnesium doping profile, namely, a magnesium doping profile that dopes the electron blocking layer with a sufficient level of magnesium, but promotes reduction in back diffusion of the magnesium into the well layers (e.g., quantum wells), thereby promoting reduction in non-radiative recombinations formation. The semiconductor assembly embodiments disclosed herein adjust where the peak of the magnesium doping concentration is centered relative to the peak of aluminum concentration in the electron blocking layer. By introducing the lithium aluminate layer into the electron blocking layer, the semiconductor assembly embodiments disclosed herein promote the above-mentioned centering control of the magnesium relative to the aluminum. The lithium aluminate layer acts as a barrier for the magnesium, causing the magnesium to concentrate at the barrier layer and to be better centered on the electron blocking layer. The lithium aluminate layer, as described herein, may be continuous or segmented (e.g., patterned) to allow for appropriate tailoring of the electrical characteristics of the semiconductor assembly. The lithium aluminate layer embodiments described herein eliminate the need for implementation of gallium nitride spacer layers for use in preventing back diffusion of magnesium into the well layers. However, one or more embodiments herein still allow for use of a gallium nitride spacer layer if one is desired. For example, in the one or more embodiments, lithium aluminate layer(s) as described herein is/are introduced into a gallium nitride spacer layer to provide an improved gallium nitride spacer layer for providing a barrier for promoting improved reduction of magnesium back diffusion into the well (MQW) layers. In one or more embodiments, at least two other ternary phases exist, $Li_5AlO_4$ and $LiAl_5O_8$ provide similar desirable properties of lithium aluminate. In examples, due to the nanoscale nature of the lithium aluminate layer(s) described herein, non-thermodynamically stable formulations from the Li—Al—O system are of value in regards to the present disclosure, while still providing adequate long term stability and reliability due to kinetic limitations.

In one or more embodiments, well layer(s) (e.g., wells) and/or barrier layer(s) (e.g., barriers) of the semiconductor assembl(ies) are p-doped.

Figure 9:
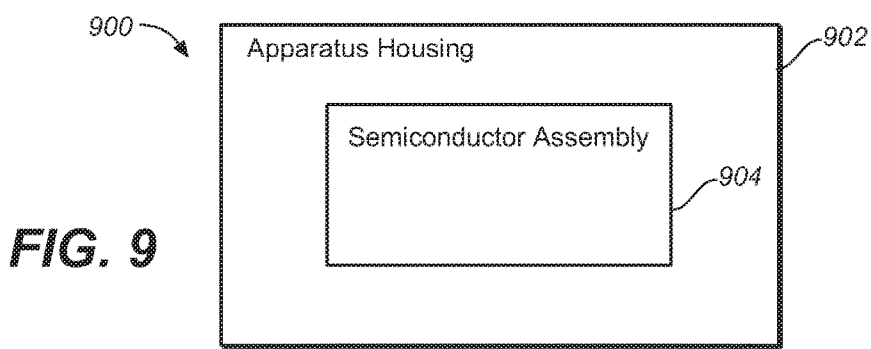
FIG. 9 is an exemplary apparatus implementing a semiconductor assembly in accordance with an exemplary embodiment of the present disclosure.

Referring to FIG. 9, in one or more embodiments, the semiconductor assemblies described herein are configured for being implemented in an apparatus (e.g., an electronic device) 900 such as, but not limited to, automobiles, optical disk playback products, lighting fixtures, notebook computers, mobile phones, digital televisions, and/or cameras. FIG. 9 illustrates the exemplary apparatus 900, the apparatus 900 having a housing 902, within which a semiconductor assembly 904, such as one of the semiconductor assembly embodiments described herein, is at least substantially contained.

Figure 8:
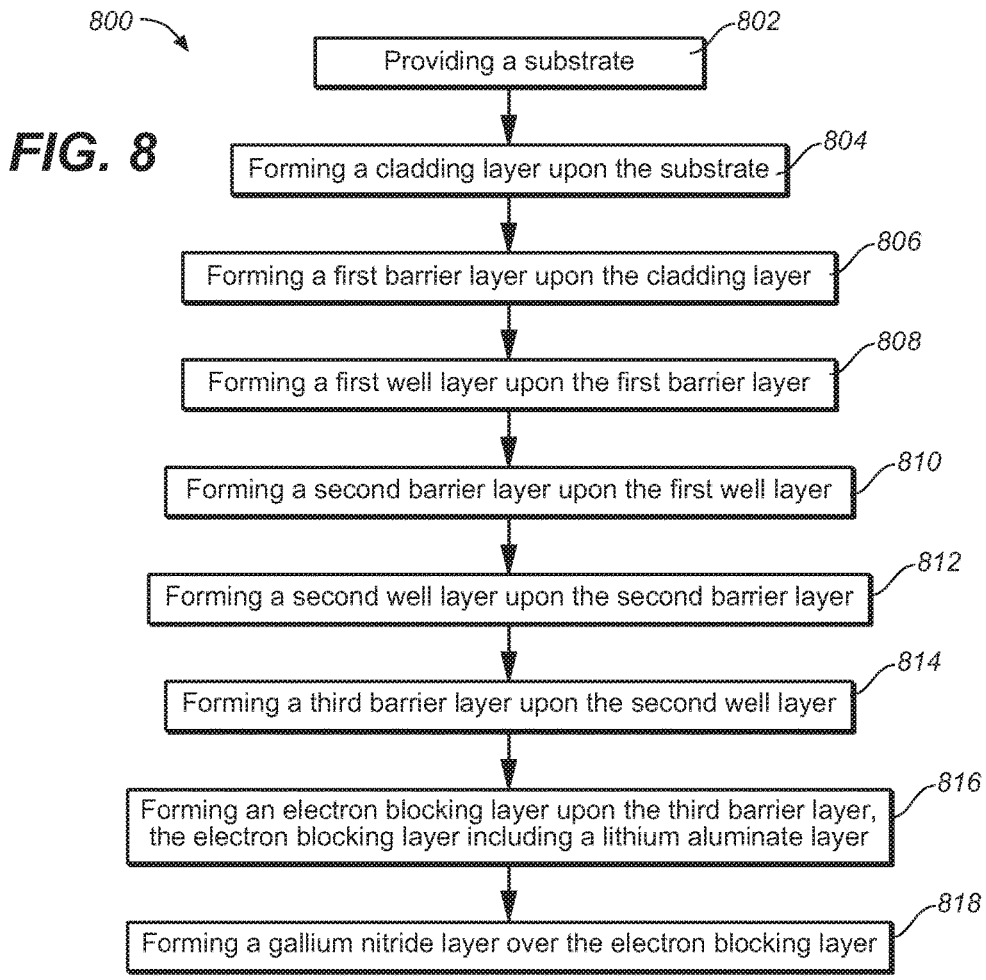
FIG. 8 is a flow chart illustrating a method for producing a semiconductor assembly as shown in FIG. 1, in accordance with an exemplary embodiment of the present disclosure.

Referring to FIG. 8 (FIG. 8), a flowchart illustrating a method of producing a semiconductor assembly is shown in accordance with an exemplary embodiment of the present disclosure. In embodiments, the method 800 includes providing a substrate, such as a lithium aluminate substrate (Block 802). The method 800 further includes forming a cladding layer, such as a silicon-doped gallium nitride cladding layer, upon the substrate (Block 804). The method 800 further includes forming a first barrier layer, such as a silicon-doped gallium nitride barrier layer, upon the cladding layer (Block 806). The method 800 further includes forming a first well layer (e.g., quantum well layer) upon the first barrier layer (Block 808). The method 800 further includes forming a second barrier layer upon the first well layer (Block 810).

In examples, the method 800 further includes forming a well layer (e.g., the second well layer) upon the second barrier layer (Block 812). The method 800 further includes forming a barrier layer (e.g., the third barrier layer) upon the second well layer (Block 814). The method 800 further includes forming an electron blocking layer upon the third barrier layer, the electron blocking layer including a lithium aluminate layer (Block 816). The method 800 further includes forming a gallium nitride layer (e.g., a magnesium-doped gallium nitride layer) over the electron blocking layer (Block 818). It is contemplated that, in one or more embodiments, one or more steps of the method 800 are performed via automated process steps.

The semiconductor assembly embodiments are exemplary. In embodiments, the barrier layers and well layers of the semiconductor assembly collectively form an active layer of the semiconductor assembly. Although the example semiconductor assembly embodiments shown in FIGS. 1-7 each have three barriers (e.g., barrier layers) and two wells (e.g., two well layers), other semiconductor assembly embodiments are contemplated. For example, semiconductor assembly embodiments having two barriers (e.g., two barrier layers) and one well (e.g., one well layer) are contemplated. Still further, embodiments in which the electron blocking layer is configured to function as one of the barrier layers are contemplated.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A semiconductor assembly, comprising:
    a layer stack, wherein the layer stack is an active layer; and
    an electron blocking layer formed upon the layer stack; and
    a lithium aluminate layer that inhibits diffusion of magnesium into the layer stack by separating the layer stack from a magnesium-doped layer.

2. The semiconductor assembly of claim 1, wherein the layer stack includes a substrate.

3. The semiconductor assembly of claim 2, wherein the layer stack includes a cladding layer, the cladding layer being formed upon the substrate.

4. The semiconductor assembly of claim 3, wherein the layer stack includes one or more barrier layers, a first barrier layer included in the one or more barrier layers being formed upon the cladding layer.

5. The semiconductor assembly of claim 4, wherein the layer stack includes one or more quantum well layers, a quantum well layer included in the one or more quantum well layers being formed upon the first barrier layer.

6. The semiconductor assembly of claim 5, wherein the lithium aluminate layer is patterned.

7. The semiconductor assembly of claim 6, wherein the patterned layer of lithium aluminate forms uniformly-spaced stripes or islands of lithium aluminate.

8. The semiconductor assembly of claim 6, wherein the patterned lithium aluminate layer is formed upon an aluminum nitride layer, the aluminum nitride layer being formed upon a second barrier layer included in the one or more barrier layers, the second barrier layer being formed upon the quantum well layer.

9. The semiconductor assembly of claim 6, wherein the patterned lithium aluminate layer forms multiple rows of interleaved islands.

10. The semiconductor assembly of claim 9, wherein the patterned lithium aluminate layer is formed upon an aluminum nitride layer, the aluminum nitride layer being formed upon a second barrier layer included in the one or more barrier layers, the second barrier layer being formed upon the quantum well layer.

11. The semiconductor assembly of claim 5, wherein the lithium aluminate layer is formed directly upon a second barrier layer included in the one or more barrier layers, the second barrier layer being formed upon the quantum well layer.

12. The semiconductor assembly of claim 5, wherein a gallium nitride layer is formed upon the electron blocking layer.

13. The semiconductor assembly of claim 1, wherein the layer stack is formed upon a lithium aluminate substrate.

14. A semiconductor assembly, comprising:
a layer stack; and
an electron blocking layer formed upon the layer stack; and
a lithium aluminate layer that inhibits diffusion of magnesium into the layer stack by separating the layer stack from a magnesium-doped layer, wherein the electron blocking layer comprises the lithium aluminate layer and the magnesium-doped layer.

15. An assembly, comprising:
a layer stack, the layer stack including a cladding layer and one or more barrier layers, a first barrier layer included in the one or more barrier layers being formed upon the cladding layer, the layer stack further including one or more quantum well layers, a quantum well layer included in the one or more quantum well layers being formed upon the first barrier layer;
an electron blocking layer formed upon the layer stack; and
a lithium aluminate layer that at least partially blocks diffusion of magnesium into the layer stack by its physical position being between the layer stack and a source of magnesium.

16. The assembly of claim 15, wherein the layer stack is formed upon a lithium aluminate substrate.

17. The assembly as claimed in claim 16, wherein the cladding layer is a silicon-doped gallium nitride cladding layer.

18. The assembly as claimed in claim 17, wherein the one or more barrier layers are silicon-doped gallium nitride barrier layers.

19. The assembly as claimed in claim 18, wherein the one or more quantum well layers are silicon-doped indium gallium nitride quantum well layers.

20. The assembly as claimed in claim 15, wherein the source of magnesium comprises a magnesium-doped layer, wherein the electron blocking layer comprises the magnesium-doped layer and the lithium aluminate layer, and wherein the lithium aluminate layer is positioned between the magnesium-doped layer and the layer stack.

* * * * *